United States Patent [19]

Thylén

[11] Patent Number: 4,742,307
[45] Date of Patent: May 3, 1988

[54] OPTICAL AMPLIFICATION DEVICE WITH NOISE FILTER FUNCTION

[75] Inventor: Lars H. Thylén, Huddinge, Sweden

[73] Assignee: Telefonaktiebolaget L M Ericsson, Stockholm, Sweden

[21] Appl. No.: 905,131

[22] Filed: Sep. 9, 1986

[30] Foreign Application Priority Data

Sep. 20, 1985 [SE] Sweden .................................. 8504375

[51] Int. Cl.[4] .................................................. H01S 3/00
[52] U.S. Cl. .................................... 330/4.3; 350/96.15; 372/6
[58] Field of Search .............................. 330/4.3; 372/6; 350/96.15, 96.16

[56] References Cited

U.S. PATENT DOCUMENTS

| | | |
|---|---|---|
| 3,957,341 | 5/1976 | Taylor . |
| 4,054,366 | 10/1977 | Barnoski et al. .................. 350/96.15 |
| 4,175,827 | 11/1979 | McMahon . |
| 4,196,964 | 4/1980 | Papuchon . |
| 4,515,431 | 5/1985 | Shaw et al. .......................... 372/6 X |
| 4,546,476 | 10/1985 | Shaw et al. ............................ 372/6 |
| 4,554,510 | 11/1985 | Shaw et al. .......................... 330/4.3 |

FOREIGN PATENT DOCUMENTS

| | | |
|---|---|---|
| 0112732 | 9/1983 | European Pat. Off. . |
| 0112090 | 6/1984 | European Pat. Off. ................ 372/6 |
| 3108814 | 3/1981 | Fed. Rep. of Germany . |

OTHER PUBLICATIONS

Printed Publication: "Semiconductor Optical Amplifier", IEEE Spectrum, May 1984, (Kobayashi et al.).

Primary Examiner—Thomas H. Tarcza
Assistant Examiner—Mark Hellner
Attorney, Agent, or Firm—Burns, Doane, Swecker & Mathis

[57] ABSTRACT

The invention relates to an optical amplification device (10) with noise filter function. A body, composed of a plurality of layers (11-15) of different materials has electrodes (16) on its opposing sides. A first (12) and a second (14) of these layers is light wave conductive and forms a directional coupler with an interaction length (2L) consisting of two coupling lengths. The other (14) of the light wave conductive layers is a travelling wave amplifier which is pumped by an electric current (I) between the electrodes (16). The dispersion of the light wave conductors varies according to different relationships, and the effective refractive index has a common value ($N_{eff0}$) for the wavelength intended for amplification. A light signal ($I_s$, $I_b$) in the first waveguide (12) migrates transversely over to the second waveguide (14), where it is amplified and migrates back again to the first waveguide (12). At the same time there is noise filtration of the signal ($I_s$, $I_b$) by a passband covering said wavelength. The noise filtered away is absorbed in the end portion ($l_2$) of the second waveguide (14), and by the light being coupled in transversely in this waveguide the amplification device (19) will be free from reflection.

16 Claims, 5 Drawing Sheets

OPTICAL AMPLIFICATION DEVICE WITH NOISE FILTER FUNCTION

TECHNICAL FIELD

The invention relates to an optical amplification device with noise filter function including a body built up from a plurality of layers of different materials.

BACKGROUND ART

In fibre-optic systems the optical signal is attenuated, inter alia in fibres and branches, and the systems are therefore equipped with amplifiers at suitable spacing to compensate for the attenuation. The amplification can take place in optical semiconductor amplifiers, e.g. of the kind described in IEEE SPECTRUM, MAY 1984, Soichi Kobayashi and Tatsuya Kimura: "Semiconductor optical amplifiers". These amplifiers essentially include a semiconductor diode, both end surfaces of which are semi-reflecting, so-called Fabry-Perot amplifiers or antireflection treated, so-called travelling wave amplifiers and are driven by an electric current or a light source. The travelling wave amplifiers have the disadvantage of generating wideband noise during the amplification, but have the advantage of accepting large tolerances in the wavelengths of an incoming signal. A bandwidth filter must therefore by installed so that an acceptable signal-to-noise ratio is obtained. A Fabry-Perot amplifier, with reflecting end surfaces may serve as such a filter and by selecting the reflectivity of the end surfaces in a suitable way a compromise between noise filtration and wavelength tolerance is obtained. This filter has the disadvantage that the transmitted signal is amplified during the filtration and is reflected back again along the incoming optical fibre, thus causing the possibility of instability in the transmission system. This instability can also occur in amplifiers with anti-reflection treated end surfaces since it is difficult to achieve a perfect anti-reflection treatment. If the instability is to be prevented, the reflected signal must be attenuated, which requires so-called optical insulators to be installed between the amplifiers. This makes the transmission systems complicated since the insulators cannot be built integrated with the amplifiers.

DISCLOSURE OF INVENTION

The above-mentioned difficulties are solved by an amplification device in accordance with the invention in which reflections of an incoming signal are avoided and the noise is filtered.

The invention is characterized by the disclosures in the accompanying claims.

BRIEF DESCRIPTION OF DRAWINGS

An embodiment of the invention will now be described in connection with a drawing where.

BEST MODE FOR CARRYING OUT THE INVENTION

Figure 1:
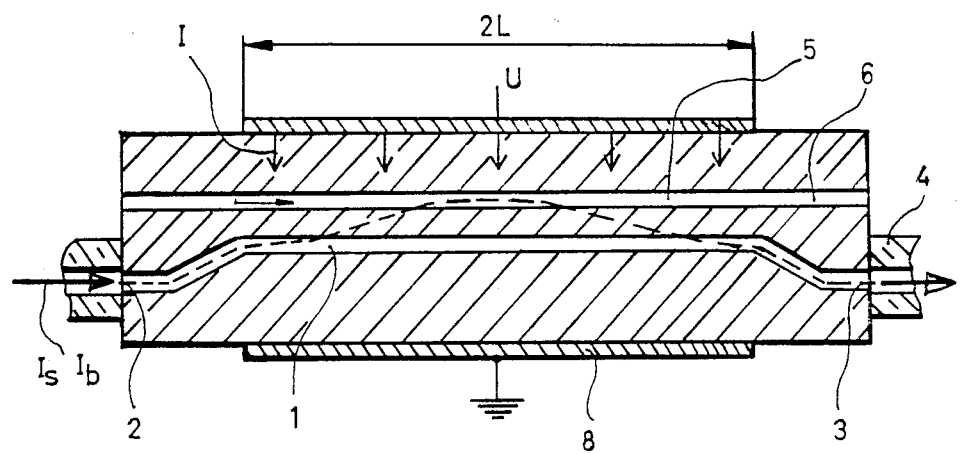
FIG. 1A schematically illustrates an inventive amplification device.
FIG. 1B illustrates an alternative inventive amplification device.

An inventive optical amplification device with noise filter is schematically illustrated in FIG. 1A. The device is essentially an optical directional coupler, one waveguide of which is an optical amplifier of the travelling wave type. The amplification device is build up from a plurality of layers with different material compositions. This is not apparent from FIG. 1A which is only intended to illustrate the basic concept of the invention and the way in which the device functions. The amplification device has a first passive waveguide 1, the input 2 and output 3 of which may be connected to optical fibres 4 for signal transmission. A second waveguide 5 of the amplification device is the mentioned travelling wave amplifier, which is more closely described in the above-mentioned reference "Semiconductor optical amplifiers". If the energy band gap in this first waveguide 1 is denoted by $E_{g1}$ and in the second waveguide 5 by $E_{g5}$ and the energy level of the signal frequency by $E_{gs}$ then:

$$E_{g1} > E_{gs} > E_{g5}$$

Figure 2:
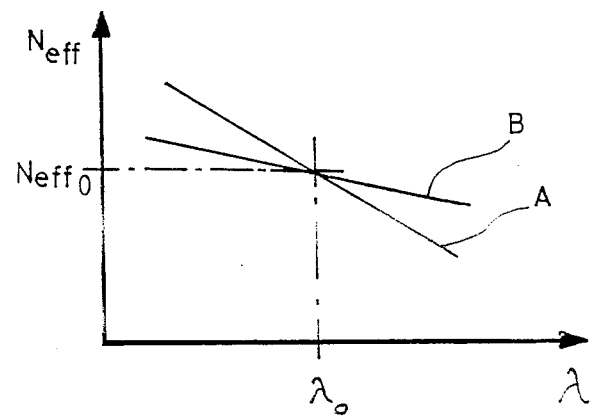
FIG. 2 is a diagram of dispersion curves for the amplification device.
Figure 3:
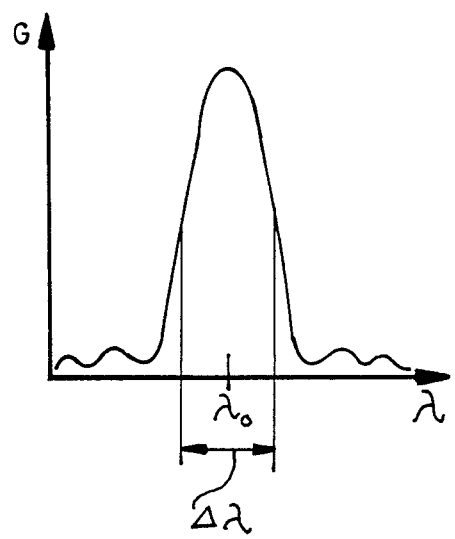
FIG. 3 shows the filter characteristic of the amplification device.
Figure 4A:
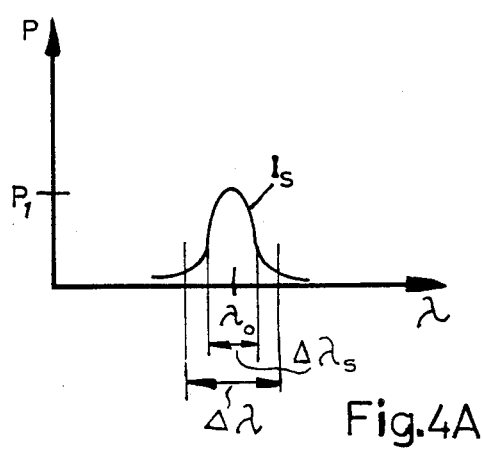
FIG. 4A shows the spectral distribution of an incoming light signal.
Figure 4B:
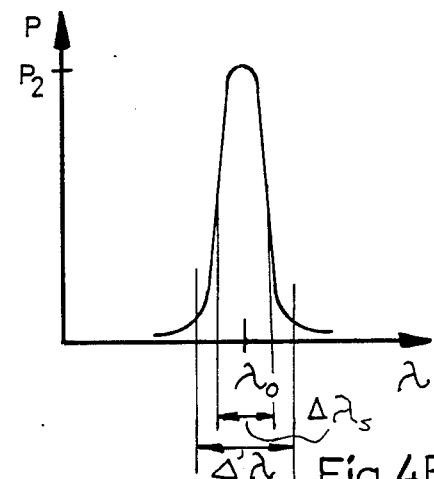
FIG. 4B shows the spectral distribution of an amplified light signal.
Figure 5A:
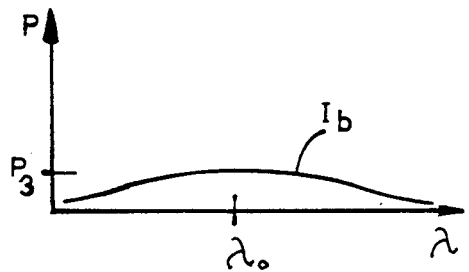
FIG. 5A shows the spectral distribution of a noise signal.
Figure 5B:
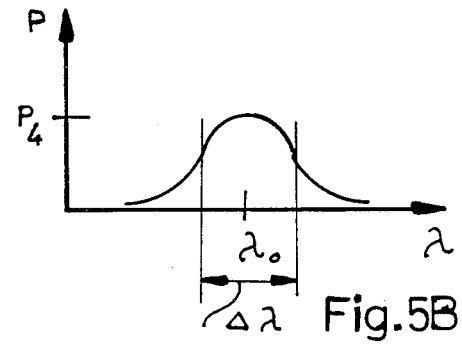
FIG. 5B shows the spectral distribution of a filtered and amplified noise signal.

The waveguide 5 has a p-n junction at its upper or lower defining surface. By current injection, i.e. electrical pumping, a population inversion can be created in the waveguide 5 so that optical amplification is obtained. The amplification device has electrodes 8 which may be connected to an outside voltage source with a pole potential U so that an electric current I can be generated, which passes through the waveguides. This current drives the travelling wave amplifier, in accordance with the above, which amplifies an incoming light signal $I_s$. An alternative embodiment of the amplification device is illustrated in FIG. 1 B, where there is a body 7a with a first passive waveguide 1a, the input 2a and output 3a of which can be connected to optical fibres 4 for signal transmission. A second waveguide 5a is the travelling wave amplifier, which is driven by a not more closely illustrated light source 8a. The latter emits a light flux Q which achieves the mentioned population inversion in the waveguide 5a, so-called optical pumping, so that amplification of the incoming light signal $I_s$ may be obtained. There are also other known possibilities of driving the amplifier, e.g. by so-called chemical pumping where the population inversion is achieved chemically. The two waveguides 1 and 5 lie close to each other along an interaction length having the length 2L and constitute the above-mentioned optical direction coupler. The incoming light signal $I_s$ can conventionally migrate over between the waveguides along the interaction length with the aid of coupled electromagnetic oscillations. The directional coupler can be implemented such that it constitutes a wavelength-dependent filter for the incoming light, as is described, e.g. in IEEE JOURNAL OF QUANTUM ELECTRONICS, Vol QE-M, No. 11, November 1978, R. C, Alferness and Peter S. Cross: "Filter Characteristics of Codirectionally Coupled Waveguides with Weighted Coupling". For filtration to take place, the waveguides must have different dispersions, as is illustrated by a diagram in FIG. 2. The effective refractive index of the waveguides is here denoted $N_{eff}$ and $\lambda$ denotes the wavelength of the incoming light signal $I_s$. The effective refractive index for a waveguide gives the phase rate for the light wave in the waveguide and depends on the refractive index N of the waveguide, this being a material constant, and also on the transverse extension of the waveguides in relation to the propogation direction of the light. In the waveguide 1, the refractive index $N_{eff}$ changes with the wavelength $\lambda$ according to a curve A, and the waveguide 5 accompanies the refractive index change according to a curve B. For a wavelength $\lambda_0$ the effective refractive index has the same value $N_{eff0}$ in both waveguides. Typical values for the effective refractive index are between 3.2–3.3 for the wavelength $\lambda_0 = 1.3$ $\mu$m. Light of the wavelength $\lambda_0$ can pass the directional coupler providing that the interaction light is an even multiple of the coupling length of the directional coupler in the embodiment illustrated in FIG. 1A. The directional coupler in FIG. 1A has the coupling length L so that the interaction length 2L corresponds to two coupling lenghts. The directional coupler is then adjusted so that the light can pass, and has a filter characteristic illustrated in FIG. 3. Here the wavelength is denoted $\lambda$, G is the relationship between the incoming and the outgoing power of the light and $\Delta\lambda$ is the filter passband. Typical values for this passband are within the interval 1–10 nm. The incoming light signal $I_s$ has a narrow wavelength spectrum with the central wavelength $\lambda_0$ and a bandwidth $\Delta\lambda_s$ according to FIG. 4A, in which P denotes the power level of the light. Typical values for the light signal bandwidth are in the interval 0,1–1nm. The light signal, which has a maximum power level $P_1$, will migrate over entirely from the first waveguide 1 to the second waveguide 5 for half the interaction length (L) as indicated by the dashed line in FIG. 1. The light signal subsequently migrates back again entirely to the first waveguide at the end (2L) of the interaction length and leaves the amplifier at the output 3. The outgoing spectrum of the light signal is practically unaltered compared with the incoming light signal, as illustrated in FIG. 4B. The light signal is amplified, and at the output 3 it has a maximum effect level $P_2$, as illustrated in the Figure, and which will be explained below. A wideband noise signal $I_b$ often accompanies the signal $I_s$ and has a maximum effect level $P_3$, e.g. as is illustrated in FIG. 5A. A typical value for the noise bandwidth is 130 nm. When this noise passes the directional coupler, filtration takes place according to the curve in FIG. 3 so that a noise signal, of considerably narrower band character according to FIG. 5B, reaches the output 3. The part of the noise signal which passes the amplification device is amplified and at the output 3 it has a maximum effect of $P_4$, according to the Figure. The part of the noise signal $I_b$ which is filtered off is transported further to an end portion 6 of the waveguide 5, according to FIG. 1, where it is spread and absorbed. The electric current I from the electrodes 8 does not reach the end portion 6, and due to the lack of current this portion has a large absorption coefficient. The noise can therefore be absorbed entirely, without being reflected at the end surface of the waveguide.

Figure 1B:
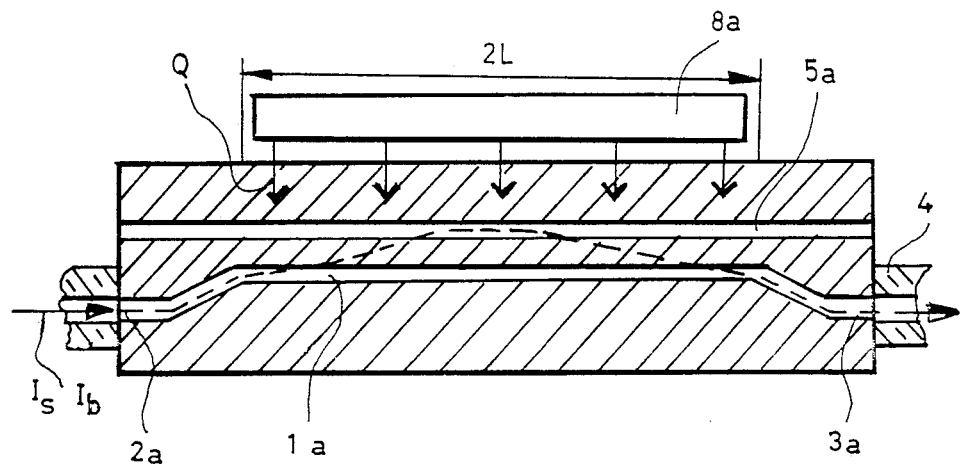

As mentioned in the introduction the waveguide 5 in FIG. 1A and FIG. 1B works as a travelling wave amplifier of known type. A light wave transported along the waveguide 5 in FIG. 1A is amplified when the electrodes 8 inject a current, which is greater than the current required to cause the light waveguide 5 to be transparent to the incoming signal. The waveguide in FIG. 1B amplifies a light signal when the light flux Q exceeds a limiting value, at which the waveguide becomes transparent to the light signal. In accordance with the invention, the light wave is coupled into the amplifier in the following way. The incoming light signal $I_s$ migrates transversely over from the first waveguide 1 to the second waveguide 5, as mentioned above. During the transport through the waveguide 5, the light signal is amplified and migrates successively back again to the waveguide 1 to leave the amplification device via the output 3. Since the light signal is coupled into the travelling wave amplifier transversely, reflections at this coupling are avoided, whereby it is avoided that reflected signals are transported via the input 2 to the incoming optical fibre 4. This non-reflective property is obtained in spite of the waveguide 5 lacking end surfaces treated for anti-reflection. The dispersions of the waveguides are adjusted in the amplification, as mentioned above, so that the amplified signal $I_s$. The incoming noise signal $I_b$ also migrates over transversely from the waveguide 1 to the waveguide 5, where it is amplified. The filtration described in connection with FIGS. 3, 5A and 5B takes place at the same time, however, so that merely a part of the amplified noise signal migrates back again to the waveguide 1. Apart from interference from the noise signal $I_b$, the incoming light signal $I_s$ is also interfered with by the wideband noise generated in the waveguide 5 when the incoming signals are amplified. This noise generated in the amplifier is also filtered so that the outgoing noise signal is given a narrowband spectrum. The light energy in the noise which is filtered way is spread via the end portion 6 of the waveguide 5, as mentioned in connection with FIG. 1A.

An inventive amplification device has been schematically illustrated in FIGS. 1A and 1B, the function of which has been described above. A more detailed embodiment of the invention, suited to the light wavelength $\lambda_0 = 1.3$ $\mu$m will now be described in connection with FIGS. 6A, 6B and 6C. In FIG. 6A there is illustrated an amplification device 10, which includes five layers 11–15 of semiconductor material arranged one above the other and with the following composition: The layer 11 is the basic material of the amplification device and comprises indium phosphide, In P. The layer 12, which is the passive waveguide in the amplification device, comprises indium-gallium-arsenide-phosphide, $In_{0.95}Ga_{0.05}As_{0.1}P_{0.9}$. The layer 13 comprises the basic material indium phosphide, while the layer 14, which is the above-mentioned travelling wave amplifier, comprises indium-gallium-arsenide-phosphide, $In_{0.7}Ga_{0.3}As_{0.7}P_{0.3}$. Finally, the layer 15 comprises the basic material indium phosphide. The layers 11 and 15 each have an electrode 16 on their outsides to generate the electric current I through the semiconductor layers. Both waveguides, the layers 12 and 14, have different proportions between indium, gallium, arsenic and phosphor, which has been denoted by the indices in the denotations In, Ga, As and P above. The proportions are selected such that the waveguides are given desired optical properties, as described below, and also a crystalline structure adapted to the basic material so that the crystalline materials can be grown one above the other. The material layers have different thicknesses, as is illustrated in FIG. 6A. The thicknesses are adapted so that the desired effective refractive indices $N_{eff}$ are obtained, as described in connection with FIG. 2. The first waveguide, the layer 12, has a thickness of 0.4 μm in the embodiment, the second waveguide, the layer 14, the thickness 0.2 μm and the intermediate layer 13 of the basic material has the thickness 1 μm. The amplification device 10 has a length $l_1$ lying, e.g., in the interval 0.2 mm to 2.0 mm. The electrodes 16 are shorter than the semiconductor layer 11–15, the ends of which project a distance $l_2$ outside the ends of the electrodes. $l_2$ can be in the interval 0.1–0.5 mm, for example. The current I is absent within the length $l_2$ in the waveguides so that the noise that has been filtered away can be absorbed, as described in connection with FIG. 1A. A certain amount of absorption of the transmitted signal also takes place here, which is avoided in an alternative embodiment described below in connection with FIG. 8.

Figure 6B:
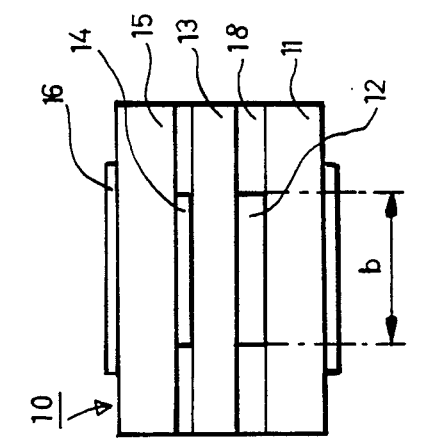
FIG. 6B is an end view of the amplification device in FIG. 6A.
Figure 6A:
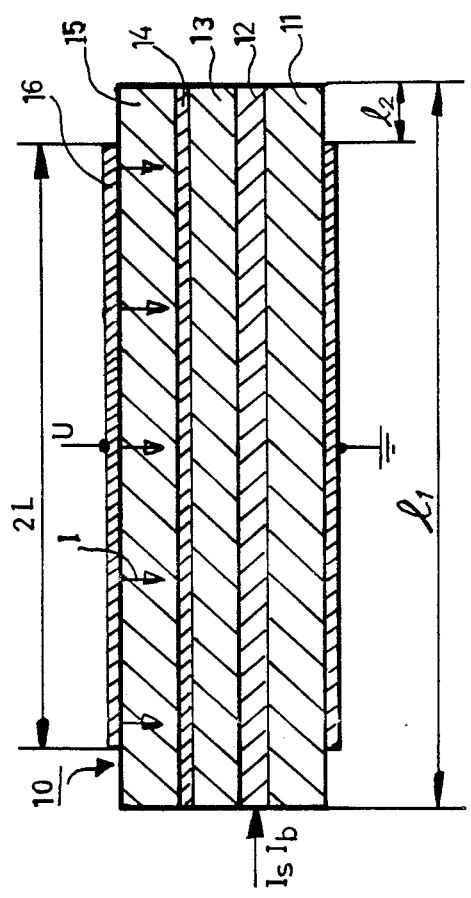
FIG. 6A is a longitudinal section through an inventive amplification device.
Figure 6C:
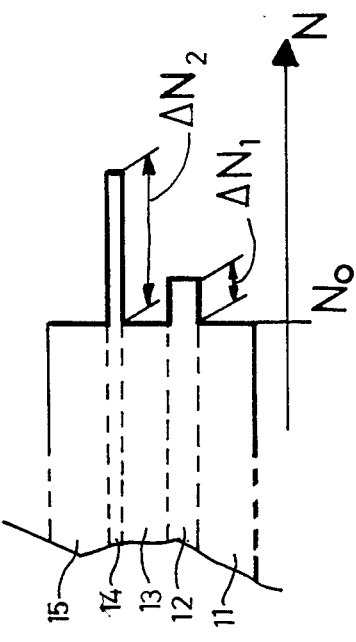
FIG. 6C is a diagram of the refractive indices for the materials in this amplification device, FIG. 7 schematically illustrates a further embodiment of the invention

An end view of the amplification device 10 is illustrated in FIG. 6B. Its waveguides 12 and 14 are surrounded laterally by the layer 18 of semiconductor material, which can be formed by the basic material (In P) of the amplification device. The waveguides have a width b which may be within the intrval 2–6 μm.

As mentioned, the effective refractive index $N_{eff}$ of the amplification device waveguides depends on the cross section dimensions of the waveguides and also on the material refractive index N, which is a material constant. The refractive index N for the different semiconductor layers 11–15 is shown by a diagram in FIG. 6C, in which the semiconductor layers have been indicated by dashed lines. The basic material indium phosphide has a refractive index $N_0 \approx 3.2$, the first waveguide (the layer 12) a refractive index exceeding $N_0$ by the value $\Delta N_1 > 0.4$ and the second waveguide (the layer 14) has a refractive index exceeding $N_0$ by the value $\Delta N_2 > 0.3$. The effective refractive index $N_{eff0}$ is greater than $N_0$ for $\lambda = 1.3$ μm, but is always less than $N_0 + \Delta N_1$ and $N_0 + \Delta N_2$.

The amplification device 10, described above, is produced from the materials indium phosphide and indium-gallium-arsenide phosphide, which come under a larger group of semiconductor materails which can be present in unary, binary, tertiary and quaternary forms. The elements which can be used in the present invention come under the third or fifth group in the periodical system, for example. There is great freedom in the selection of the materials for an amplification device in accordance with the present invention. What is decisive for material selection is that integration of active and passive waveguides with differential dispersion according to FIG. 2 can be achieved. Apart from the examples of material mentioned above, the materials gallium arsenide and gallium-aluminium-arsenide can also be mentioned.

Figure 7:
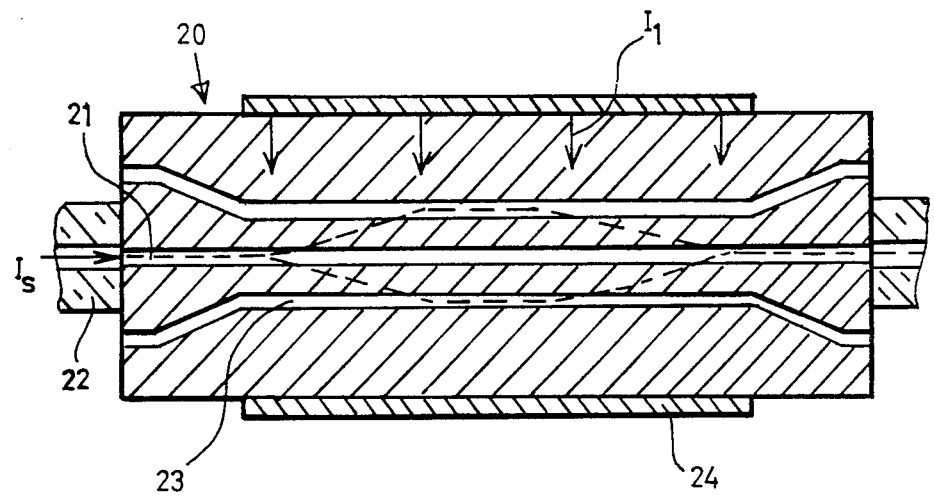

In the amplification device with optical pumping described in FIG. 1B, the waveguide 5a (the travelling wave amplifier) is produced from quartz which has been doped with neodymium, Nd or yttrium aluminium garnet which has been doped with the same substance neodynium. The amplification device described above according to FIGS. 1A and 1B has only one waveguide 5, which is a travelling wave amplifier. A further embodiment of the invention is illustrated schematically in FIG. 7. Here, an optical amplification device 20 has a first waveguide 21, the inputs and outputs of which can be connected to optical fibres 22 for signal transmission of the light signal $I_s$. On either side of the waveguide 21 there is a waveguide 23, which is a travelling wave amplifier. The amplification device has electrodes 24 for generating an electric current I passing through the waveguides. The light signal $I_s$ migrates over to the waveguide 23 where it is amplified and migrates back again to the waveguide 21, as indicated by the dashed lines. Amplification, noise filtration and extinguishing of the noise signal take place in the way described in connection with the optical amplification device according to FIG. 1A.

Figure 8:
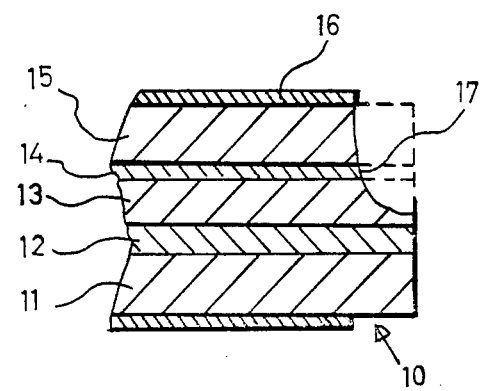
FIG. 8 is a cross section of an alternative embodiment of the amplification device according to FIG. 6A.

In connection with FIG. 1, it was mentioned that the noise filtered away was absorbed in the end portion 6 of the traveling-wave amplifier 5. An alternative implementation of this part of the amplification device, in which the end portion is removed by etching is shown in FIG. 8. This Figure shows a part of the amplification device in FIG. 6A. The parts of the layers 13, 14 and 15 which have been removed by the etching are indicated by dashed lines. The layer 14 (the travelling wave amplifier) has an etched end surface 17 in which the light is powerfully spread so that it cannot be reflected and migrate back to the input of the waveguide 12.

What is claimed is:

1. An optical amplification device with noise filter function including a body built up from a plurality of layers of different materials, wherein at least a first one of the layers (1, 1a, 12) is a light wave conductor having a first effective index of refraction which varies with wavelength according to a first relationship, at least one further of the layers (5, 5a, 14) is a light wave conductor which can amplify a light wave ($I_s$, $I_b$) propagating in this further layer and which has a second effective index of refraction which varies with wavelength according to a second relationship different from the first relationship, the second effective index being substantially equal to the first effective index at a predetermined wavelength intended for amplification, further including drive means (8, 8a, 16) for providing an excitation (I, Q) to the at least one further layer, the excitation causing the further layer to become transparent to and to amplify light propagating in the further layer and including light of the predetermined wavelength when the excitation exceeds a predetermined value required to make this further layer (5, 5a, 14) transparent to the light wave, and wherein the light wave conductive layers (1, 1a, 12 and 5, 5a, 14) are optically coupled so that a directional coupler is created, an interaction length (2L) of which is substantially an even number of coupling lengths (L) for the predetermined wavelength, the further layer amplifying light coupling from the first layer and propagating in the further layer and the first and second relationships being selected so that the optical amplification device filters light passing therethrough.

2. Optical amplification device as claimed in claim 1, characterized in that the drive means includes electrodes (16) on either side of the body (11, 12, 13, 14, 15), between which an electric current (I) can be sent for exciting the further layer (14).

3. Optical amplification device as claimed in claim 1, characterized in that the drive means includes a light source (8a) at one side of the body (7a), said light source emitting a light flux (Q) for exciting the further layer (5a).

4. Optical amplification device as claimed in claim 1 characterized in that the light wave conductive layers (12, 14) are indium-gallium-arsenide-phosphide and the remaining layers are indium-phosphide.

5. Optical amplification device as claimed in claim 1, characterized in that the further light wave conductive layer (5a) is neodymium doped quartz, or neodymium doped yttrium aluminium garnet.

6. Optical amplification device as claimed in claim 1, characterized in that the further light wave conductive layer (14) is longer than the electrodes (16) so that there may be formed at least one area ($1_2$) free from electric current in this layer, in which the light which has been filtered away is absorbed.

7. Optical amplification device as claimed in claim 1, characterized in that the further light wave conductive layer (14) has an etched end surface (17) so that light incident on the end surface is dispersed.

8. Optical amplification device as claimed in claim 1, characterized in that the interaction length (2L) is two coupling lengths.

9. Optical amplification device as claimed in claim 2, characterized in that the light wave conductive layers are indium-gallium-arsenide-phosphide and the remaining layers are indium-phosphide.

10. Optical amplification device as claimed in claim 3, characterized in that the further light wave conductive layer is neodymium doped quartz, or neodymium doped yttrium aluminum garnet.

11. Optical amplification device as claimed in claim 2, characterized in that the further light wave conductive layer is longer than the electrodes so that there may be formed at least one area free from electric current in this layer, in which the light which has been filtered away is absorbed.

12. Optical amplification device as claimed in claim 4, characterized in that the further light wave conductive layer is longer than the electrodes so that there may be formed at least one area free from electric current in this layer, in which the light which has been filtered away is absorbed.

13. Optical amplification device as claimed in claim 9, characterized in that the further light wave conductive layer is longer than the electrodes so that there may be formed at least one area free from electric current in this layer, in which the light which has been filtered away is absorbed.

14. Optical amplification device as claimed in claim 2, characterized in that the further light wave conductive light has an etched end surface so that light incident on the end surface is dispersed.

15. Optical amplification device as claimed in claim 4, characterized in that the further light wave conductive layer has an etched end surface so that light incident on the end surface is dispersed.

16. Optical amplification device as claimed in claim 9, characterized in that the further light wave conductive layer has an etched end surface so that light incident on the end surface is dispersed.

* * * * *

UNITED STATES PATENT AND TRADEMARK OFFICE
CERTIFICATE OF CORRECTION

PATENT NO. : 4,742,307

DATED : May 3, 1988

INVENTOR(S) : Lars H. Thylén

It is certified that error appears in the above-identified patent and that said Letters Patent is hereby corrected as shown below:

Column 3, line 26, "light" should be -- length --.
Column 4, line 29, -- signal has substantially the same spectral distribution as the incoming -- should be inserted between "amplified" and "signal".

Signed and Sealed this

Twentieth Day of December, 1988

Attest:

DONALD J. QUIGG

Attesting Officer

Commissioner of Patents and Trademarks